(12) United States Patent
Chang et al.

(10) Patent No.: US 9,210,832 B2
(45) Date of Patent: Dec. 8, 2015

(54) THERMAL BUFFERING ELEMENT

(71) Applicant: ASUSTeK COMPUTER INC., Taipei (TW)

(72) Inventors: Kuang-Yu Chang, Taipei (TW); Ing-Jer Chiou, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 223 days.

(21) Appl. No.: 13/953,742

(22) Filed: Jul. 30, 2013

(65) Prior Publication Data

US 2014/0043769 A1 Feb. 13, 2014

Related U.S. Application Data

(60) Provisional application No. 61/682,318, filed on Aug. 13, 2012.

(30) Foreign Application Priority Data

Jul. 1, 2013 (CN) .......................... 2013 1 0270709

(51) Int. Cl.
*H05K 7/20* (2006.01)
*G06F 1/20* (2006.01)
*H01L 23/427* (2006.01)

(52) U.S. Cl.
CPC .............. *H05K 7/2039* (2013.01); *G06F 1/203* (2013.01); *H01L 23/4275* (2013.01); *H05K 7/20509* (2013.01); *H01L 2924/0002* (2013.01)

(58) Field of Classification Search
CPC .............. H05K 7/20; G06F 1/20; F28F 7/00; H01L 23/28; H01L 23/36; H01L 23/02; F28D 17/00

USPC ............ 361/679.46, 679.54, 679.53, 679.55, 361/698–704, 707–714, 715, 719; 165/80.2, 80.3, 80.4, 80.5, 104.32, 165/104.11, 104.13, 104.33, 185; 174/15.1, 174/15.2, 16.3, 252; 257/706–727
See application file for complete search history.

(56) References Cited

U.S. PATENT DOCUMENTS

| 5,007,478 | A | * | 4/1991 | Sengupta ......................... 165/10 |
| 5,224,356 | A | * | 7/1993 | Colvin et al. ................. 62/259.2 |
| 5,288,769 | A | * | 2/1994 | Papageorge et al. .......... 523/200 |
| 5,315,154 | A | * | 5/1994 | Elwell ............................. 257/707 |
| 5,455,458 | A | * | 10/1995 | Quon et al. .................... 257/714 |
| 6,040,362 | A | | 3/2000 | Mine et al. |
| 6,397,618 | B1 | * | 6/2002 | Chu et al. ...................... 62/259.2 |
| 6,621,702 | B2 | * | 9/2003 | Elias et al. ..................... 361/700 |

(Continued)

FOREIGN PATENT DOCUMENTS

| CN | 2660413 Y | 12/2004 |
| CN | 101619206 A | 1/2010 |

(Continued)

*Primary Examiner* — Michail V Datskovskiy
(74) *Attorney, Agent, or Firm* — CKC & Partners Co., Ltd.

(57) ABSTRACT

A thermal buffering element applied to an electronic device is provided. The thermal buffering element includes a heat absorbing material and a plurality of metal particles. The heat absorbing material is disposed corresponding to a heat source of the electronic device. The metal particles are distributed in the heat absorbing material. The invention solves the problem of uneven heat dissipation of an electronic product, which makes a user feel more comfortable.

6 Claims, 6 Drawing Sheets

(56) References Cited

U.S. PATENT DOCUMENTS

| | | | | |
|---|---|---|---|---|
| 6,848,500 | B1 * | 2/2005 | Langari et al. | 165/104.33 |
| 7,002,800 | B2 * | 2/2006 | Elias et al. | 361/700 |
| 7,316,262 | B1 * | 1/2008 | Rini et al. | 165/10 |
| 8,130,496 | B2 * | 3/2012 | Dong et al. | 361/700 |
| 2003/0142477 | A1 * | 7/2003 | Elias et al. | 361/700 |
| 2008/0128121 | A1 | 6/2008 | Zhou | |
| 2009/0294094 | A1 | 12/2009 | Suzuki et al. | |
| 2010/0038053 | A1 * | 2/2010 | Maxik et al. | 165/80.2 |
| 2010/0319876 | A1 * | 12/2010 | Yoshida et al. | 165/80.2 |
| 2012/0171546 | A1 * | 7/2012 | Tagawa et al. | 429/120 |
| 2012/0280382 | A1 * | 11/2012 | Im et al. | 257/712 |

FOREIGN PATENT DOCUMENTS

| | | | | |
|---|---|---|---|---|
| CN | 102504565 A | | 6/2012 | |
| JP | 410107190 A | * | 4/1998 | H01L 23/36 |
| JP | 02005347684 A | * | 12/2005 | H01L 23/40 |
| JP | 02011023545 A | * | 2/2011 | H01L 23/36 |
| TW | 1256711 B | | 6/2006 | |

\* cited by examiner

THERMAL BUFFERING ELEMENT

CROSS-REFERENCE TO RELATED APPLICATION

This application claims the priority benefit of U.S. provisional application Ser. No. 61/682,318, filed on Aug. 13, 2012, and Chinese application serial No. 201310270709.9 filed on Jul. 1, 2013. The entirety of the above-mentioned patent application is hereby incorporated by reference herein and made a part of specification.

BACKGROUND OF THE INVENTION

1. Field of the Invention

The invention relates to a thermal buffering element.

2. Description of the Related Art

Nowadays, a heat dissipating element applied to an electronic product is usually a fan, a heat dissipating fin, a heat pipe or a liquid cooling device. As science technologies develop, a notebook computer, a tablet computer and a mobile phone become thinner and thinner, but the size of the heat dissipating elements is difficult to be reduced. Consequently, the thickness of the electronic product cannot be reduced much, which brings inconvenience to users.

Moreover, a thin heat conducting sheet or a heat dissipating fin may be attached to a heat source of the electronic product, but the conventional heat conducting sheet or the heat dissipating fin can only transfer heat and provide a heat transferring path, and it cannot store heat, which makes it difficult to maintain the temperature of the electronic product. That means, the conventional heat conducting sheet or the heat dissipating fin have limit contribution to make the heat distribution of the electronic product uniform, and it cannot help the users feel comfortable.

BRIEF SUMMARY OF THE INVENTION

A thermal buffering element applied to an electronic device is provided. A thermal buffering element includes a heat absorbing material and a plurality of metal particles. The heat absorbing material is disposed corresponding to a heat source of the electronic device. The metal particles are distributed in the heat absorbing material.

These and other features, aspects and advantages of the present invention will become better understood with regard to the following description, appended claims, and accompanying drawings.

DETAILED DESCRIPTION OF THE EMBODIMENTS

A thermal buffering element is illustrated with relating figures, and the same symbols denote the same components.

Figure 1:
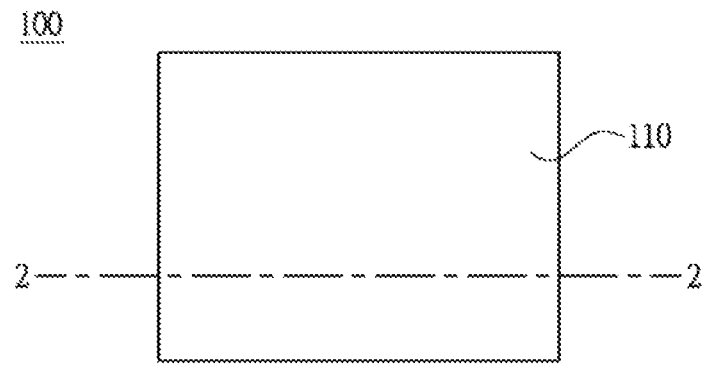
FIG. 1 is a top view showing a thermal buffering element in a first embodiment.
Figure 2:
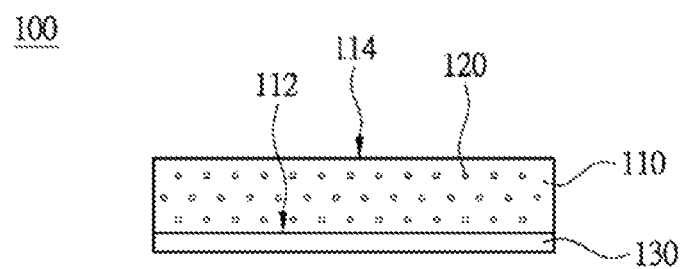
FIG. 2 is a sectional diagram showing the thermal buffering element in FIG. 1 along a line 2-2.

FIG. 1 is a top view showing a thermal buffering element 100 in a first embodiment. FIG. 2 is a sectional diagram showing the thermal buffering element 100 in FIG. 1 along a line 2-2. Please refer to FIG. 1 and FIG. 2, the thermal buffering element 100 includes a heat absorbing material 110 and a plurality of metal particles 120. The metal particles 120 are distributed in the heat absorbing material 110.

The heat absorbing material 110 can store heat, and the metal particles 120 can transfer heat. In the embodiment, the heat absorbing material 110 may be paraffin, which is not limited herein. The metal particles 120 may be copper particles or aluminum particles with a high heat conducting coefficient, which are not limited.

The thermal buffering element 100 further includes a first thermal diffusion material 130. The first thermal diffusion material 130 covers a surface 112 of the heat absorbing material 110. The first thermal diffusion material 130 may include one or a combination of copper, aluminum and graphite. The first thermal diffusion material 130 may be fixed at the heat absorbing material 110 via gluing or hot pressing. The first thermal diffusion material 130 can improve the heat transferring speed of the thermal buffering element 100.

Figure 3:
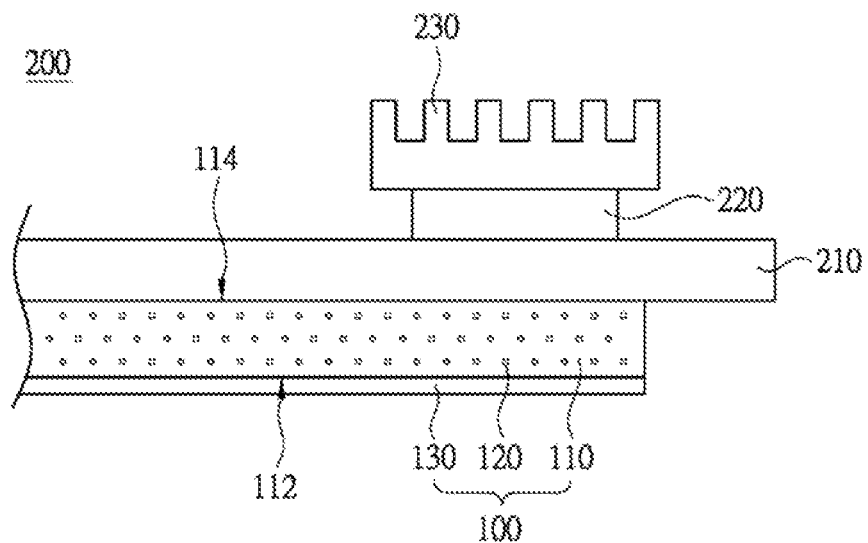
FIG. 3 is a sectional diagram showing the thermal buffering element in FIG. 2 disposed at a back surface of a circuit board of an electronic device.

FIG. 3 is a sectional diagram showing the thermal buffering element 100 in FIG. 2 disposed at a back surface of a circuit board 210 of an electronic device 200. A heat source 220 of the electronic device 200 is disposed at a front surface of the circuit board 210, and the heat dissipating fins 230 are fixed at the heat source 220. The heat source 220 may be a central processing unit (CPU) or a video chip, and the circuit board 210 may be a computer motherboard, which is not limited herein. In the embodiment, the heat absorbing material 110 and the heat source 220 are disposed at two opposite surfaces (one surface back to the heat source 220 and the other surface facing the heat source 220) of the circuit board 210, respectively, and at least a part of the thermal buffering element 100 is extended to a position below the heat source 220 to make the heat absorbing material 110 disposed corresponding to the heat source 220.

When the heat source 220 generates heat, the heat absorbing material 110 can store heat of the heat source 220, and the metal particles 120 can improve the heat transferring speed of the thermal buffering element 100. When the thermal buffering element 100 is disposed at a surface of the circuit board 210 back to the heat source 220, the thermal buffering element 100 stores the heat from the heat source 220 and spreads it evenly, and it makes the temperature of the electronic device 200 be distributed evenly. In the embodiment, both of the metal particles 120 and the first thermal diffusion material 130 can improve the heat conducting speed of the thermal buffering element 100.

Furthermore, when the temperature of the heat source 220 changes sharply (for example, when the heat source 220 overclocks or the electronic device 200 is power off), the thermal buffering element 100 can reduce the temperature changing speed of the electronic device 200 via the heat absorbing material 110, and it manages the whole temperature of the electronic device 200 to make the temperature increase or decrease slowly. Thus, the service life of components in the electronic device 200 is extended, and when the user uses the electronic device 200, he or she would not feel a large temperature difference, and the users would not get scalded.

Figure 4:
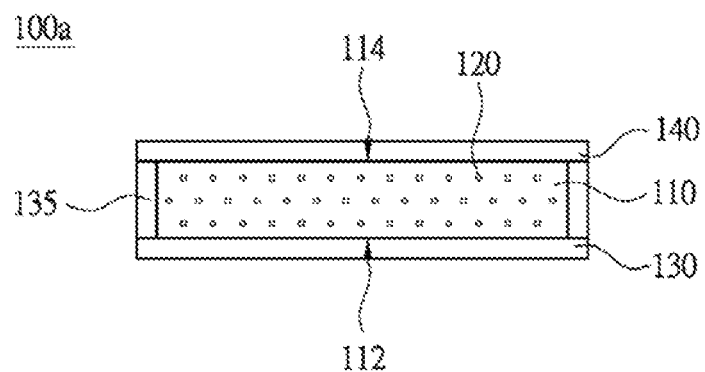
FIG. 4 is a sectional diagram showing a thermal buffering element in a second embodiment.
Figure 5:
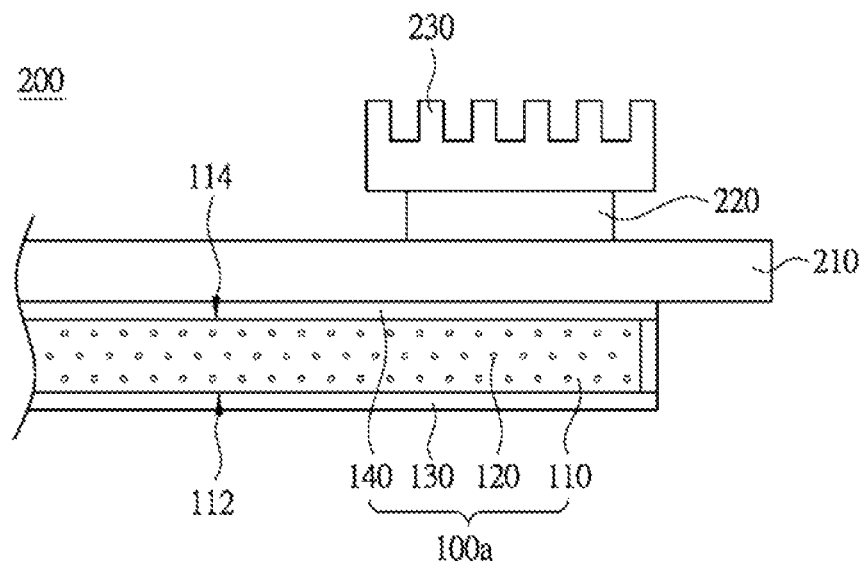
FIG. 5 is a sectional diagram showing the thermal buffering element in FIG. 4 disposed at a back surface of a circuit board of an electronic device.

FIG. 4 is a sectional diagram showing a thermal buffering element 100a in a second embodiment. FIG. 5 is a sectional diagram showing the thermal buffering element 100a in FIG. 4 disposed at a back surface of the circuit board 210 of the electronic device 200. Please refer to FIG. 4 and FIG. 5, the thermal buffering element 100a includes the heat absorbing material 110, a plurality of the metal particles 120 and the first thermal diffusion material 130. The difference between the embodiments in FIG. 2 and FIG. 3 is that the thermal buffering element 100a further includes a second thermal diffusion material 140. The second thermal diffusion material 140 covers another surface 114 of the heat absorbing material 110 opposite to the first thermal diffusion material 130, and thus the heat absorbing material 110 is between the first thermal diffusion material 130 and the second thermal diffusion material 140.

When the thermal buffering element 100a is in use, the second thermal diffusion material 140 contacts with the back surface of the circuit board 210, and the second thermal diffusion material 140 and the heat source 220 are disposed at two opposite surfaces of the circuit board 210. The thermal buffering element 100a can store the heat from the heat source 220 and spread it evenly, which makes the temperature of the electronic device 200 distributed evenly.

In the embodiment, the second thermal diffusion material 140 may include one or a combination of copper, aluminum and graphite, and the second thermal diffusion material 140 may be the same as or different from the first thermal diffusion material 130, which is not limited herein. Since the two surfaces 112 and 114 of the heat absorbing material 110 are covered by the first thermal diffusion material 130 and the second thermal diffusion material 140, respectively, the heat conducting speed of the thermal buffering element 100a is higher than that of the thermal buffering element 100 in FIG. 2. Moreover, the first thermal diffusion material 130 may be connected to the second thermal diffusion material 140 via a connecting material 135. The connecting material 135 may be glue or a diffusion material similar with the first thermal diffusion material 130 and the second thermal diffusion material 140, which is not limited herein.

Figure 6:
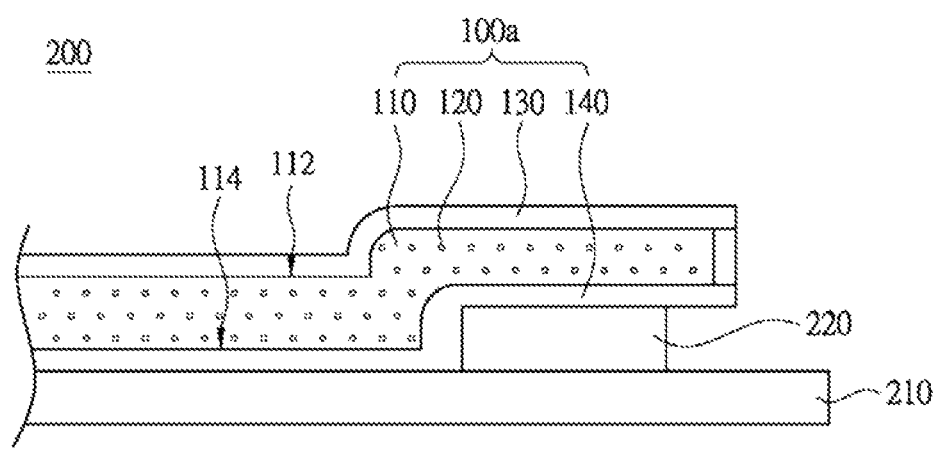
FIG. 6 is a sectional diagram showing the thermal buffering element in FIG. 4 disposed at a front surface of a circuit board of an electronic device.

FIG. 6 is a sectional diagram showing the thermal buffering element 100a in FIG. 4 disposed at a front surface of the circuit board 210 of the electronic device 200. The difference between this embodiment and the embodiment in FIG. 5 is that the second thermal diffusion material 140 of the thermal buffering element 100a covers the heat source 220 and the circuit board 210. That means, the thermal buffering element 100a and the heat source 220 are disposed at the same side of the circuit board 210. At least a part of the thermal buffering element 100a is above the heat source 220, and it contacts with the heat source 220 via the second thermal diffusion material 140. The thermal buffering element 100a can store the heat from the heat source 220 and spread it evenly, which makes the temperature of the electronic device 200 distributed evenly. In the embodiment, the heat dissipating fins 230 at the heat source 220 in FIG. 5 can be omitted.

Figure 7:
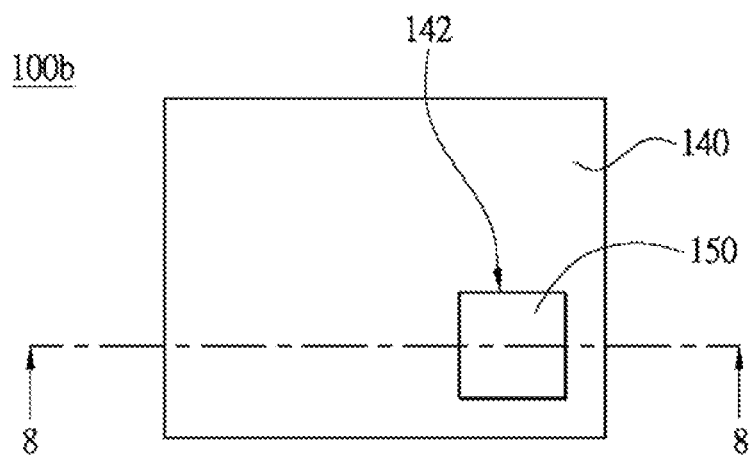
FIG. 7 is a top view showing a thermal buffering element in a third embodiment.
Figure 8:
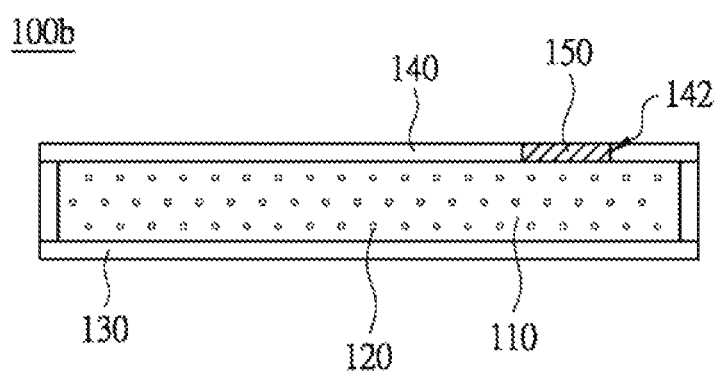
FIG. 8 is a sectional diagram showing the thermal buffering element in FIG. 7 along a line 8-8.

FIG. 7 is a top view showing a thermal buffering element 100b in a third embodiment. FIG. 8 is a sectional diagram showing the thermal buffering element 100b in FIG. 7 along a line 8-8. Please refer to FIG. 7 and FIG. 8, the thermal buffering element 100b includes the heat absorbing material 110, a plurality of the metal particles 120, the first thermal diffusion material 130 and the second thermal diffusion material 140. The difference between this embodiment and the embodiment in FIG. 4 is that the second thermal diffusion material 140 has an opening 142, and the thermal buffering element 100b further includes an insulating material 150. The insulating material 150 is disposed in the opening 142.

Figure 9:
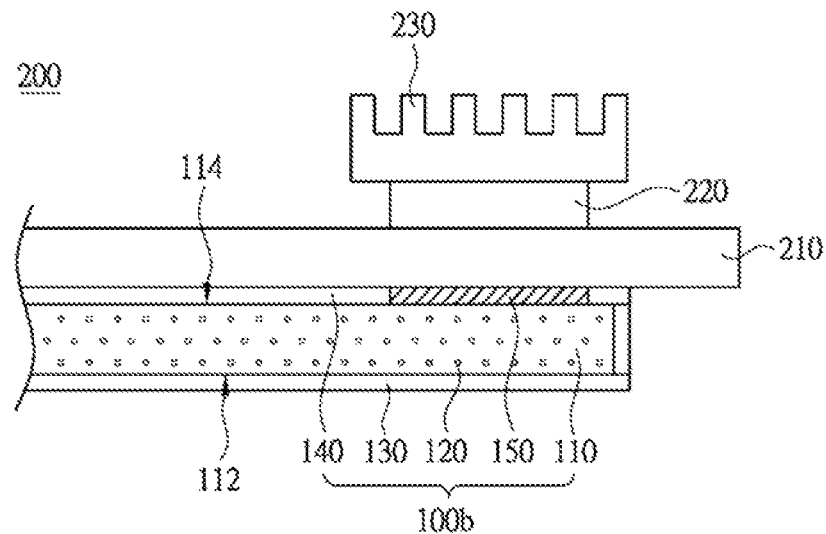
FIG. 9 is a sectional diagram showing the thermal buffering element in FIG. 8 disposed at a back surface of a circuit board of an electronic device.

FIG. 9 is a sectional diagram showing the thermal buffering element 100b in FIG. 8 disposed at a back surface of the circuit board 210 of the electronic device 200. When the thermal buffering element 100b is used, the second thermal diffusion material 140 of the thermal buffering element 100b contacts with the back surface of the circuit board 210, and the insulating material 150 and the opening 142 are disposed corresponding to a position of the circuit board 210 which is easy to have a short circuit. In the embodiment, the insulating material 150 is below the heat source 220, which is not limited herein. The thermal buffering element 100b can store the heat from the heat source 220 and spread it evenly, which makes the temperature of the electronic device 200 distributed evenly. In the embodiment, the insulating material 150 may be plastic, rubber or ceramic, which is not limited herein. The insulating material 150 can prevent the second thermal diffusion material 140 from contacting a connecting point of the heat source 220 at the back surface of the circuit board 210, and it can avoid a short circuit.

Figure 10:
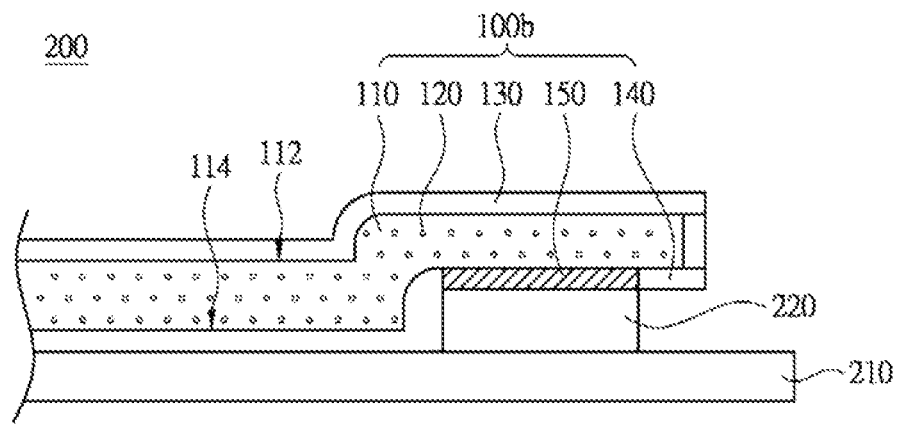
FIG. 10 is a sectional diagram showing the thermal buffering element in FIG. 8 disposed at a front surface of a circuit board of an electronic device.

FIG. 10 is a sectional diagram showing the thermal buffering element 100b in FIG. 8 disposed at a front surface of the circuit board 210 of the electronic device 200. The difference between this embodiment and the embodiment in FIG. 9 is that the second thermal diffusion material 140 of the thermal buffering element 100b covers the heat source 220 and the circuit board 210. That means, the thermal buffering element 100b and the heat source 220 are at the same side of the circuit board 210. At least a part of the thermal buffering element 100b covers the heat source 220, and the thermal buffering element 100b contacts with the heat source 220 via the second thermal diffusion material 140. Thus, the thermal buffering element 100b can store the heat from the heat source 220 and spread it evenly, which makes the temperature of the electronic device 200 distributed evenly. In the embodiment, the heat dissipating fins 230 of the heat source 220 in FIG. 9 can be omitted.

Figure 11:
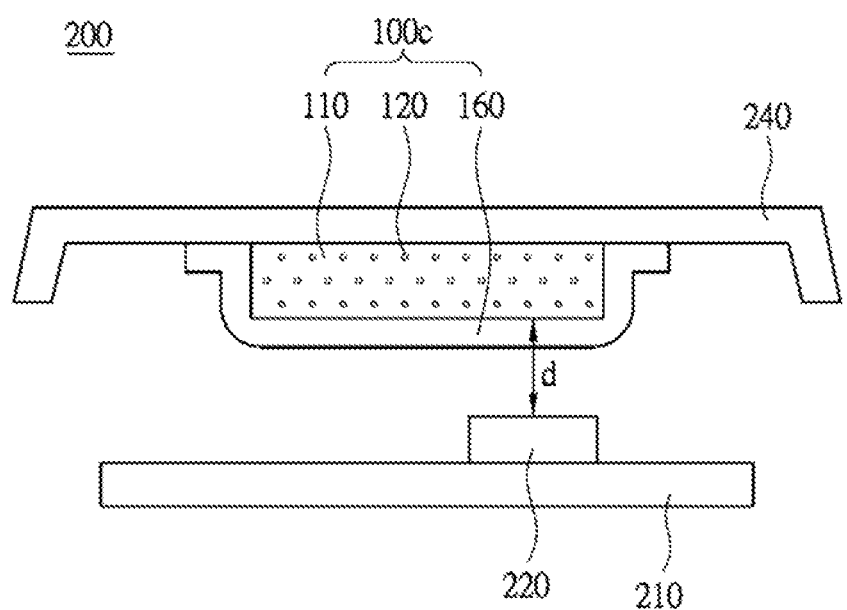
FIG. 11 is a sectional diagram showing a thermal buffering element disposed at a casing of an electronic device in a fourth embodiment.

FIG. 11 is a sectional diagram showing a thermal buffering element 100c disposed at a casing 240 of the electronic device 200 in a fourth embodiment. The thermal buffering element 100c includes the heat absorbing material 110, a plurality of the metal particles 120 and a protective tape 160. The heat absorbing material 110 is disposed at the casing 240 of the electronic device 200, and the protective tape 160 is attached to the heat absorbing material 110 and the casing 240 to make the heat absorbing material 110 keep a distance d with the heat source 220 at the circuit board 210.

When the heat source 220 generates heat, hot air rises and the temperature of the thermal buffering element 100c above the heat source 220 increases. The thermal buffering element 100c can store the heat from the heat source 220 and spread it evenly, which makes the temperature of the electronic device 200 distributed evenly.

When the thermal buffering element is in use, the heat absorbing material can store the heat from the heat source, and the metal particles can improve the heat conducting speed of the thermal buffering element. Thus, when the thermal buffering element is above the heat source, at the back surface of the circuit board which is opposite to the heat source, or at the casing which is adjacent to the heat source, the thermal buffering element can store the heat from the heat source and spread it evenly, which makes the temperature of the electronic device distributed evenly and prevents the parts around the heat source from getting too hot.

When the temperature of the heat source changes sharply, since the heat absorbing material can absorb and release heat, the thermal buffering element can reduce the temperature changing speed of the electronic device, which facilitates managing the whole temperature of the electronic device. Thus, the service life of components in the electronic device is extended, and when the user uses the electronic device, he or she would not feel a big temperature difference, and they would not get scalded.

Since the thermal buffering element can be selectively disposed at the back surface, the front surface of the circuit board or the inner surface of the casing, and the thermal buffering element is thin and is in a sheet shape, it can use the space in the electronic device more flexibly.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A thermal buffering element applied to an electronic device, wherein the electronic device includes a heat source, the thermal buffering element comprising:
   a heat absorbing material disposed corresponding to the heat source;
   a plurality of metal particles distributed in the heat absorbing material;
   a first thermal diffusion material covering a surface of the heat absorbing material; and
   a second thermal diffusion material covering another surface of the heat absorbing material opposite to the first thermal diffusion material, wherein the heat absorbing material is between the first thermal diffusion material and the second thermal diffusion material, and the heat source is disposed at a circuit board of the electronic device, and the second thermal diffusion material covers the heat source and the circuit board.

2. The thermal buffering element according to claim 1, wherein the first thermal diffusion material includes one or a combination of copper, aluminum and graphite.

3. The thermal buffering element according to claim 1, wherein the heat absorbing material and the heat source are disposed at two opposite surfaces of the circuit board, respectively.

4. The thermal buffering element according to claim 1, wherein the second thermal diffusion material and the heat source are disposed at two opposite surfaces of the circuit board, respectively.

5. The thermal buffering element according to claim 1, wherein the second thermal diffusion material includes one or a combination of copper, aluminum and graphite.

6. A thermal buffering element applied to an electronic device, wherein the electronic device includes a heat source, the thermal buffering element comprising:
   a heat absorbing material disposed corresponding to the heat source;
   a plurality of metal particles distributed in the heat absorbing material;
   a first thermal diffusion material covering the surface of the heat absorbing material;
   a second thermal diffusion material covering another surface of the heat absorbing material opposite to the first thermal diffusion material, wherein the heat absorbing material is between the first thermal diffusion material and the second thermal diffusion material, and the second thermal diffusion material includes an opening; and
   an insulating material in the opening, wherein the insulating material and the opening are disposed corresponding to a position of a circuit board which is easy to have a short circuit.

\* \* \* \* \*